United States Patent
Huang et al.

(10) Patent No.: US 7,460,397 B2
(45) Date of Patent: Dec. 2, 2008

(54) METHOD FOR READING MULTIPLE-VALUE MEMORY CELLS

(75) Inventors: Chien-Fu Huang, Hsinchu (TW); Fuja Shone, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 135 days.

(21) Appl. No.: 11/692,909

(22) Filed: Mar. 28, 2007

(65) Prior Publication Data
US 2008/0239804 A1  Oct. 2, 2008

(51) Int. Cl.
*G11C 11/34* (2006.01)
(52) U.S. Cl. .................. 365/185.03; 365/185.18; 365/185.19; 365/185.22; 365/185.23; 365/185.24
(58) Field of Classification Search ............ 365/185.03, 365/185.18, 185.19
See application file for complete search history.

(56) References Cited

U.S. PATENT DOCUMENTS 5,621,682 A * 4/1997 Tanzawa et al. ........ 365/185.03
5,870,218 A * 2/1999 Yyouno et al. ......... 365/185.03
6,026,014 A * 2/2000 Sato et al. ............. 365/185.03
6,038,165 A * 3/2000 Miwa et al. ............ 365/185.03
6,222,763 B1   4/2001 Sato et al.
6,301,150 B1  10/2001 Kanamitsu et al.
6,771,537 B2   8/2004 Jyouno et al.

* cited by examiner

*Primary Examiner*—Lun-Yi Lao
*Assistant Examiner*—Thao Bui
(74) *Attorney, Agent, or Firm*—Winston Hsu (57) ABSTRACT

A read method for multiple-value information in a semiconductor memory such as a nonvolatile semiconductor memory is introduced. The method includes obtaining a first data from a selected multiple-value memory cell by applying a first voltage to a control gate of the selected multiple-value memory cell. A second data from the selected multiple-value memory cell is obtained by applying a second voltage to the control gate of the selected multiple-value memory cell. A first bit of the plurality of bits stored in the selected multiple-value memory cell is then obtained by performing a predetermined calculation on the first data and the second data. A second bit of the plurality of bits is obtained from the selected multiple-value memory cell by applying a third voltage to the control gate of the selected multiple-value memory cell.

5 Claims, 14 Drawing Sheets

|      | A | B | C | D |
|------|---|---|---|---|
| VRW3 | 1 | 0 | 0 | 0 |
| VRW2 | 1 | 1 | 0 | 0 |
| VRW1 | 1 | 1 | 1 | 0 |

METHOD FOR READING MULTIPLE-VALUE MEMORY CELLS

BACKGROUND OF THE INVENTION

1. Field of the Invention

The present invention relates to a read method, and more particularly, to a read method for multiple-value memory cells in a semiconductor memory such as a nonvolatile semiconductor memory.

2. Description of the Prior Art

In recent years, because of the increasing demand for memory, a new type of memory, which is a so called multiple-value memory, was developed to meet the demand.

Figure 1:
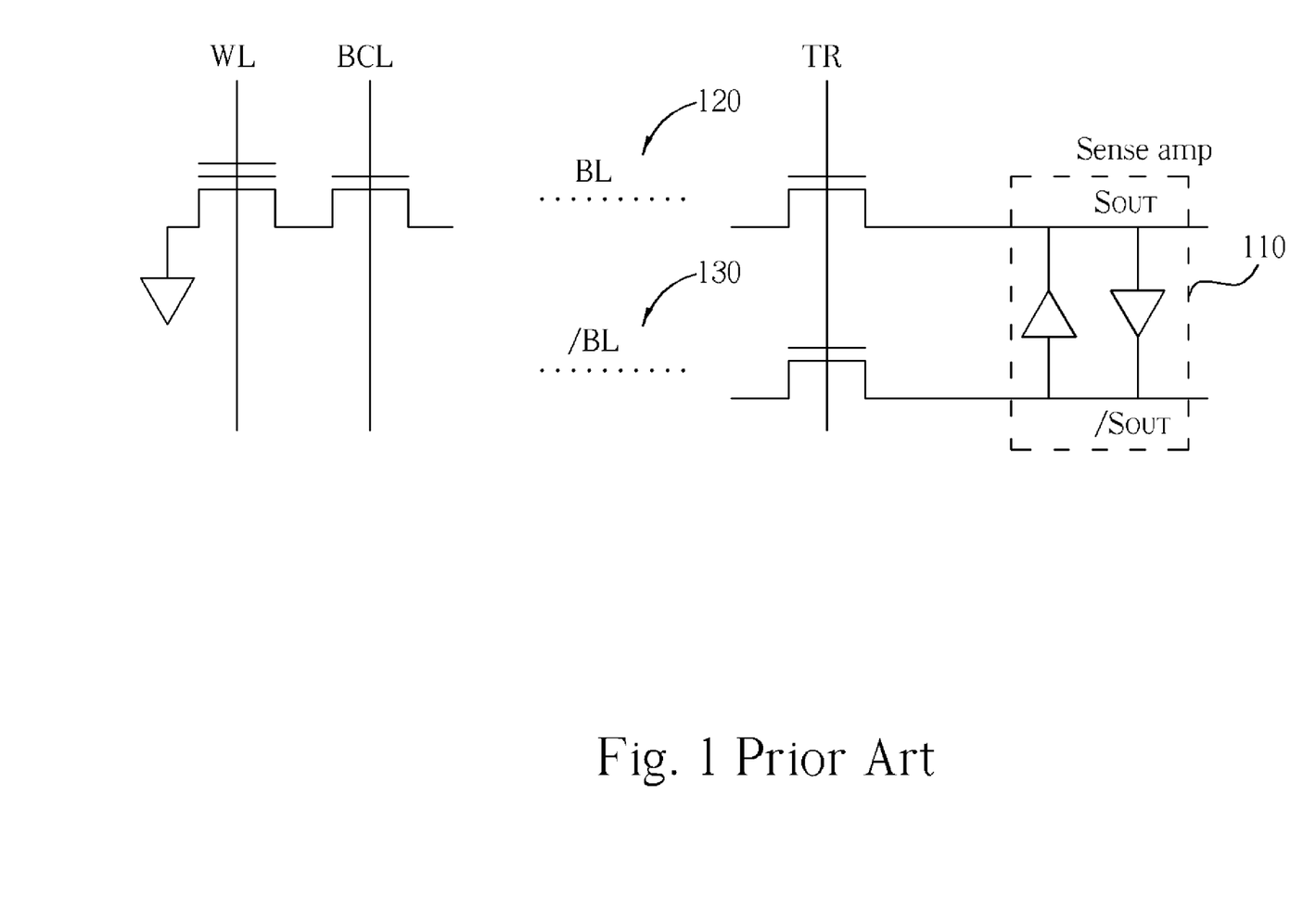
FIG. 1 is a diagram illustrating a multiple-value memory unit of a conventional circuit.

The multiple-value memory technique is based on non-volatile semiconductor memory. A multiple-value memory uses a nonvolatile memory cell having a control gate and a floating gate as a memory cell. It is possible to constitute the memory cell out of one transistor. Please refer to FIG. 1, which is a conceptual method for storing information comprising a plurality of bits in and reading the stored information from a transistor 100. Data are stored in the transistor 100 as its thresholds. When the stored data is read, first the bit line 120 is pre-charged to 1V and the conjugate bit line 130 is pre-charged to 0.5V. Second, the word line 140 is turned on. If the threshold of the transistor 100 is higher than the voltage of the word line 140, the voltage of the bit line 120 is still 1V. If the threshold of the transistor 100 is lower than the voltage of the word line 140, the voltage of the bit line 120 is discharged to ground. Then the sense amplifier 110 is activated to compare the voltages of the bit line 120 and the conjugate bit line 130. If the voltage of the bit line 120 is ground voltage while the voltage of the conjugate bit line 130 is 0.5V, the sense amplifier outputs "0". And if the voltage of the bit line 120 is 1V while the voltage of the conjugate bit line 130 is 0.5V, the sense amplifier outputs "1".

Figure 2:
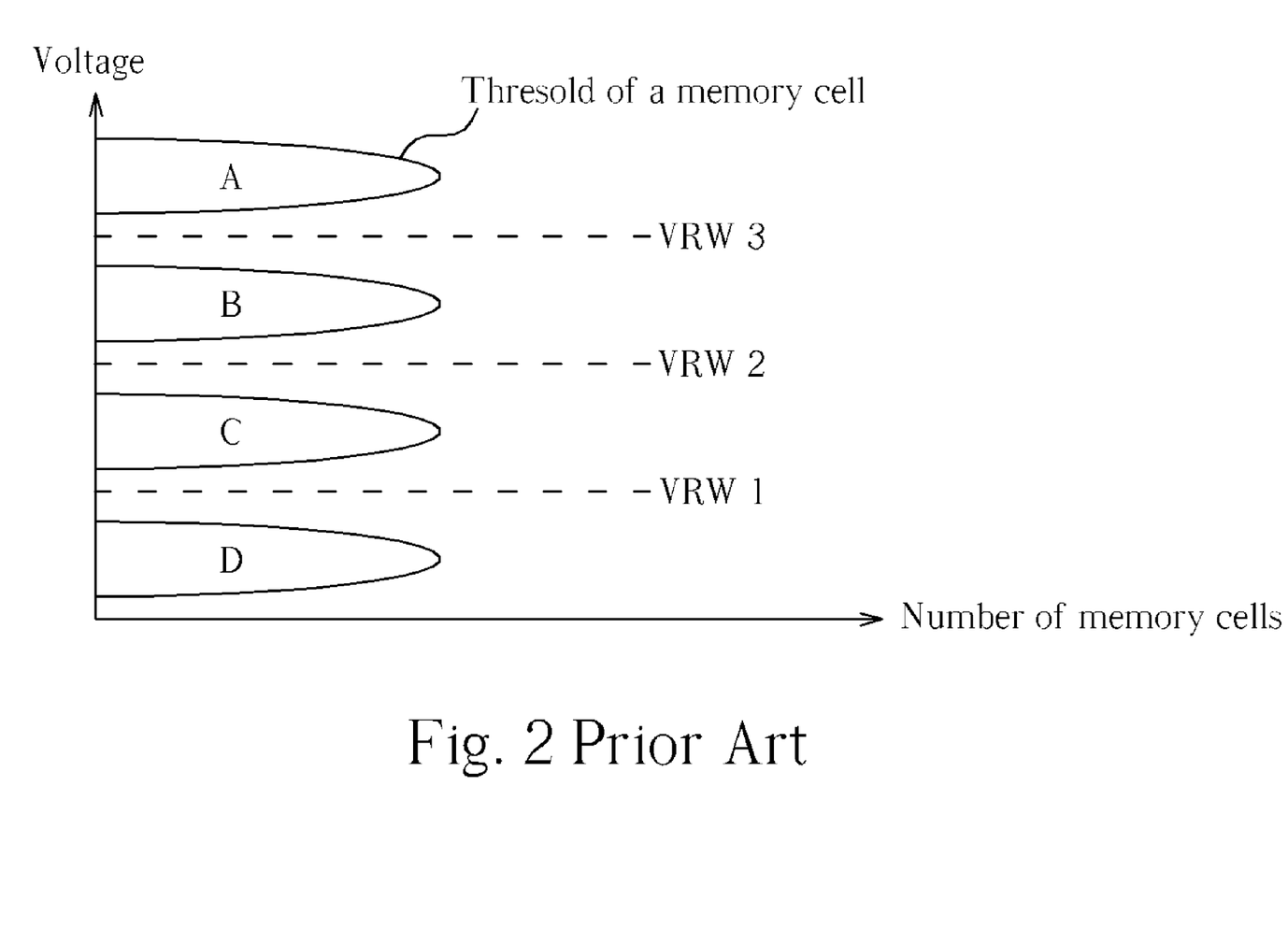
FIG. 2 is a distribution diagram of a four-value memory cell of the prior art.
Figure 3:
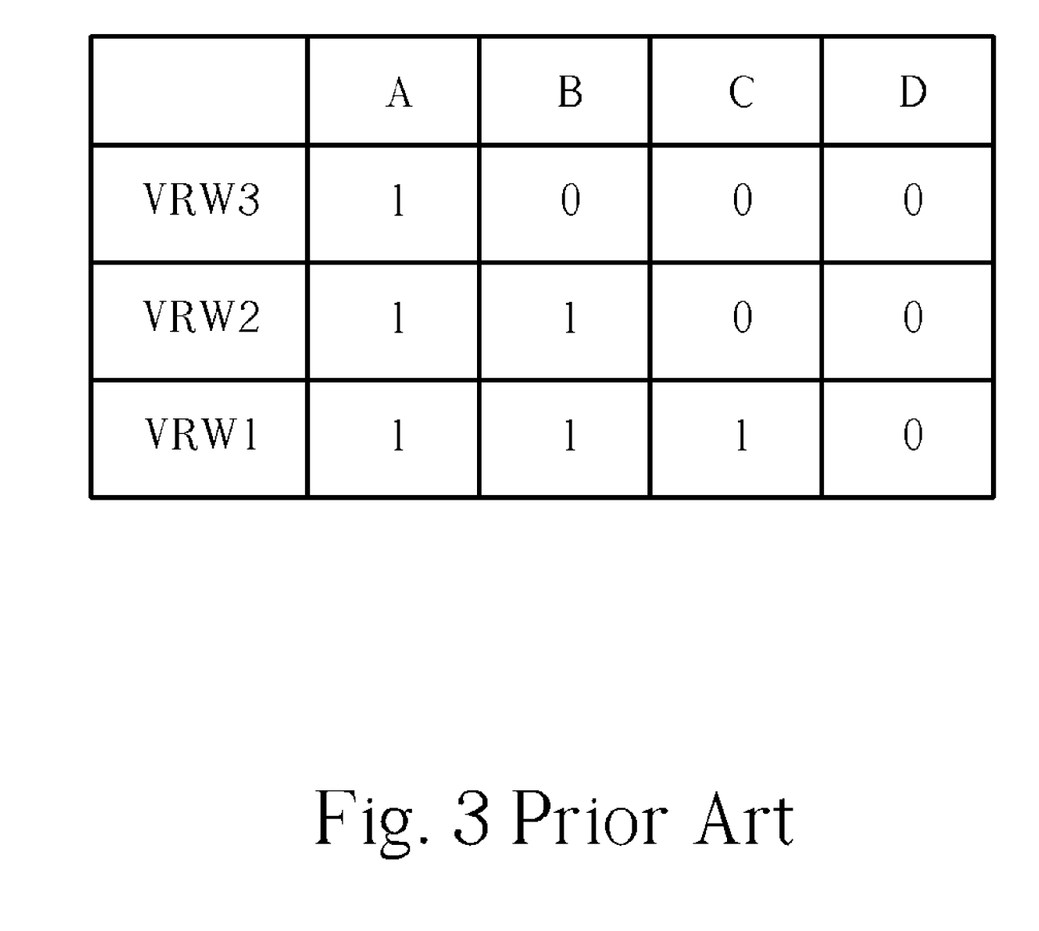
FIG. 3 is a diagram illustrating example relationships of the distribution of the thresholds and the read voltages.

When storing information into the transistor 100, stepwise changing of thresholds to 1V, 2V, 3V, . . . , can make one bit of information of a plurality of bits correspond to each threshold value. FIG. 2 shows a threshold value distribution state when storing information by dividing one memory cell into four threshold value states. It is difficult to accurately control the threshold value of a memory cell to a predetermined value for a write operation, and therefore, as shown in FIG. 2, a normal distribution is established around each target threshold voltage. To read data, voltages corresponding to the valleys of the threshold value distributions are read, set as VRW1, VRW2, and VRW3, and applied to a control gate through a word line. For example, please go back to refer to FIG. 1, if the threshold of the transistor 100 falls in the threshold value distribution B, when voltage VRW3 is applied to the word line 140, the sense amplifier 110 is "0". If voltage VRW2 is applied to the word line 140, the sense amplifier 110 is "1". When voltage VRW1 is applied to the word line 140, the sense amplifier 110 is "1". Please refer to FIG. 3. As the example described above, FIG. 3 shows the results of reading data at the sense amplifier 110 from memory cells belonging to the threshold value distributions A, B, C, D by using the above read voltages VRW1, VRW2, and VRW3 (VRW1<VRW2<VRW3).

Figure 4:
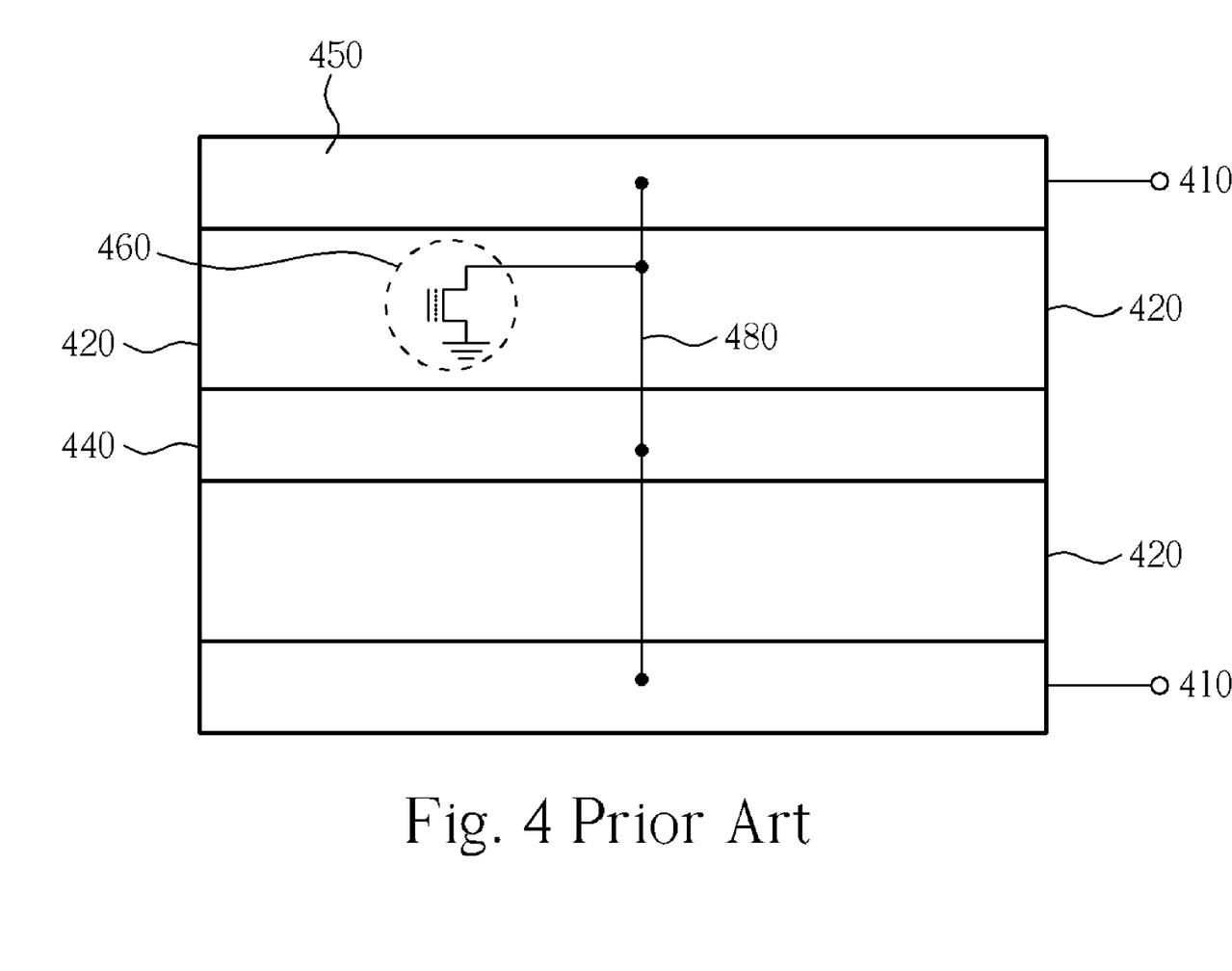
FIG. 4 is a block diagram illustrating a conventional system of multiple-value memory cells.

Please refer to FIG. 4. FIG. 4 is a diagram illustrating a conventional memory device using multiple-value cells. When reading a selected multiple-value memory cell 460 in a memory array 420, a word line 470 coupled to a control gate of the selected multiple-value memory cell 460 is charged to voltages of VRW1, VRW2, and VRW3 step by step. Then the two-bit data stored in the multiple-value memory cell 460 is transferred to a right data latch 450 and a left data latch 430 through a sense amplifier (SA) 440 coupled to the right data latch (DL) 450 and the left data latch 430 with the bit line 480. Then right data latch 450 and left data latch 430 output the transferred data to external circuits through input/output ports 410.

Figure 5:
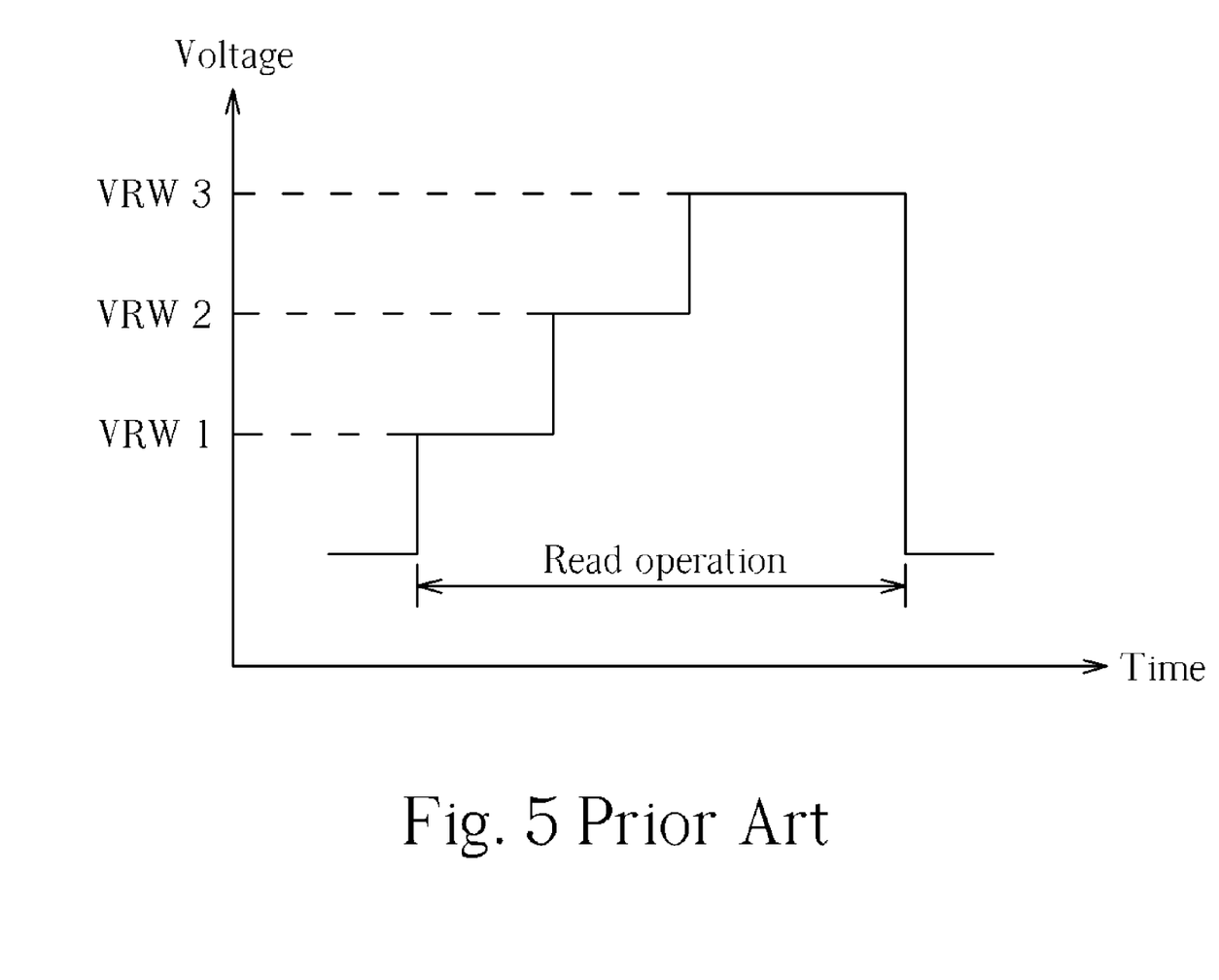
FIG. 5 is a diagram illustrating voltages applied to the word line in a read operation of the prior art.

Please refer to FIG. 5 that is a diagram illustrating the voltage of the word line 470 of the selected multiple-value memory cell 460 of FIG. 4 in a read operation. First, the word line 470 is charged to voltage VRW1. Next the word line 470 is charged to voltage VRW2. Finally the word line 470 is charged to voltage VRW3.

Figure 6:
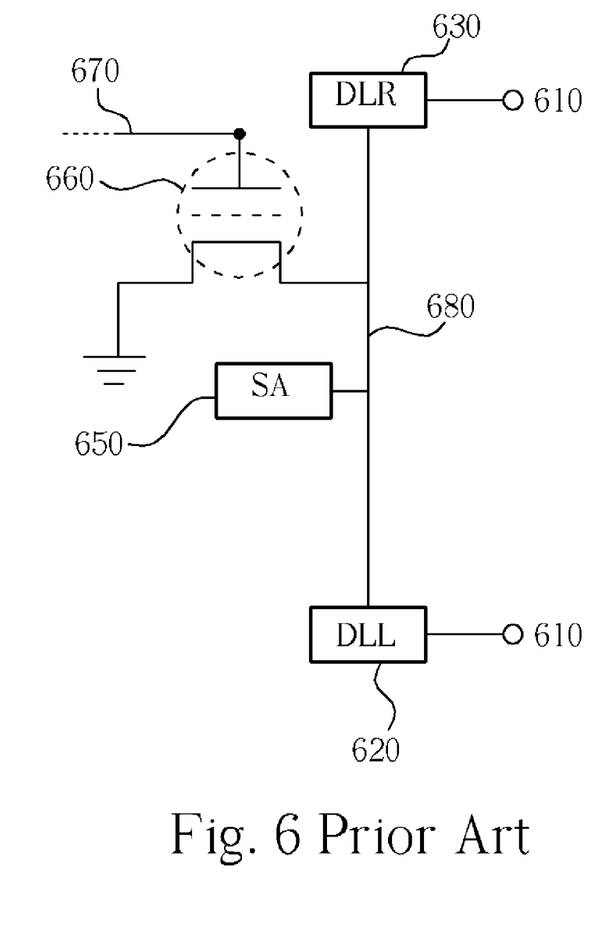
FIG. 6 is a circuit diagram of a multiple-value memory cell of the prior art.
Figure 7:
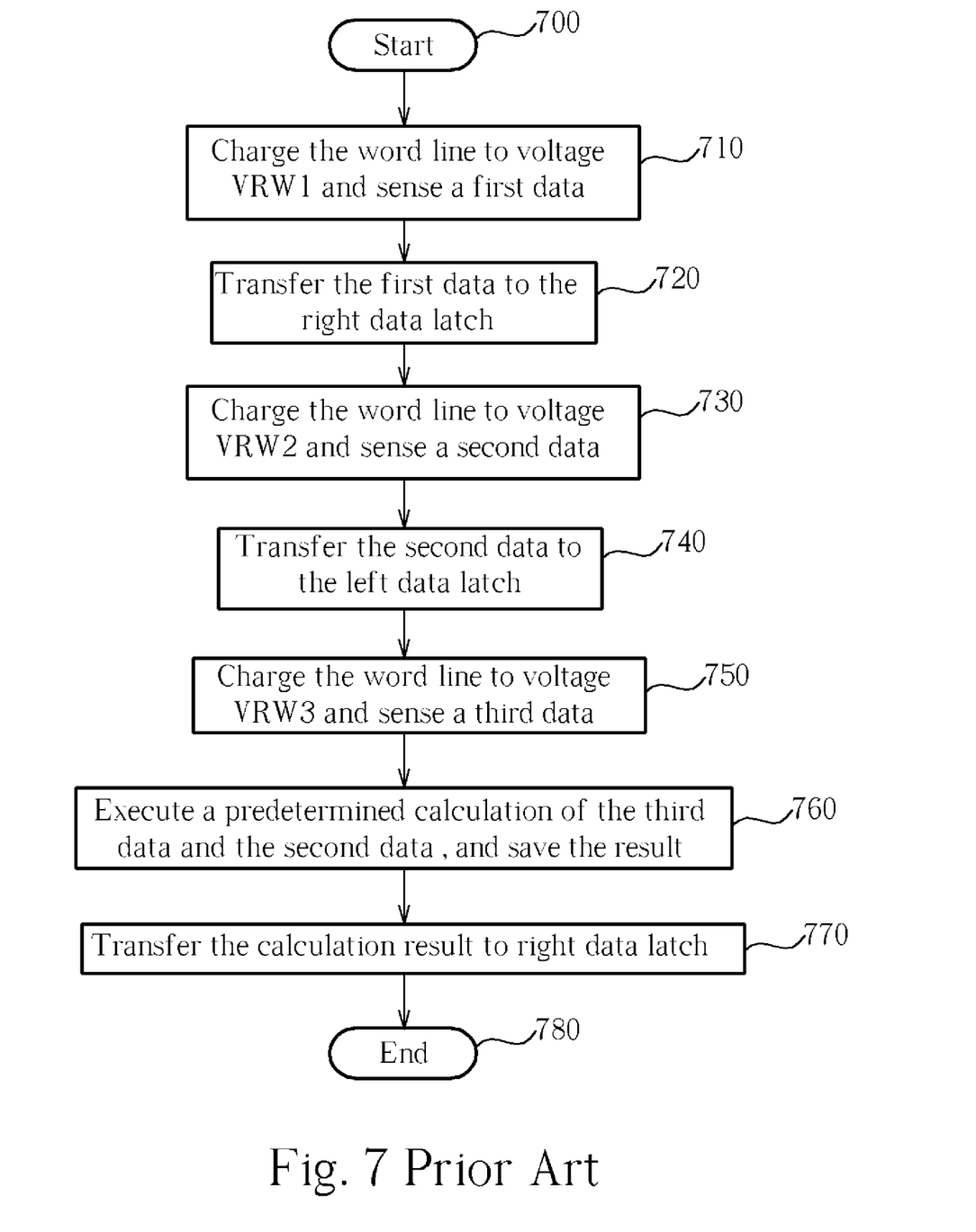
FIG. 7 is a flowchart of a read operation of the multiple-value memory cell of FIG. 6.

Please refer to FIG. 6, which is a diagram illustrating one multiple-value memory cell unit of the memory array based on FIG. 4 in a conventional memory system. The multiple-value memory cell unit is provided with a right data latch 630, a left data latch 620, a sense amplifier 650, a bit line 680, a word line 670, a multiple-value memory cell 660, and input/output ports 610. Please refer to FIG. 7 together with FIG. 6. FIG. 7 is a flowchart of a read operation based on FIG. 6. The read steps are described in sequential order as follows:

Step 700: Start.

Step 710: Charge the word line 670 to voltage VRW1 and sense a first data stored in the multiple-value memory cell 660 using the sense amplifier 650 through the bit line 680.

Step 720: Transfer the first data stored in the sense amplifier 650 to the right data latch 630 through the bit line 680.

Step 730: Charge the word line 670 to voltage VRW2 and sense a second data stored in the multiple-value memory cell 660 using the sense amplifier 650 through the bit line 680.

Step 740: Transfer the second data stored in the sense amplifier 650 to the left data latch 620 through the bit line 680.

Step 750: Charge the word line 670 to voltage VRW3 and sense a third data stored in the multiple-value memory cell 660 using the sense amplifier 650 through the bit line 680.

Step 760: Execute a predetermined calculation of the third data in the sense amplifier and the second data in the right data latch, and save the result of data calculation in sense amplifier.

Step 770: Transfer the calculation result in sense amplifier to right data latch.

Step 775: Output the memory cell data stored in right/left data latch through input/output ports 610.

Step 780: End.

According to the prior art, the right data latch is necessary to store the first data, the left data latch is necessary to store the second data, and the sense amplifier is necessary to store the third data. The first and third data are then utilized to generate the actual lower bit information stored in 2-bits per cell memory cell, while the data stored in left data latch is the actual higher bit information of memory cell. So the actual two bits information stored in memory cell are now read out in the left and right data latch.

The first disadvantage of the conventional memory system and read operation is that each multiple-value memory cell is provided with two data latches and one sense amplifier so that it is not easy to reduce the total circuit cost. Secondly, the conventional method restricts the sequence of the voltages applied to the word line to be VRW1, VRW2, and VRW3 while the relationships between the three voltages must be VRW1<VRW2<VRW3 so that this method is not flexible.

SUMMARY OF THE INVENTION

It is therefore a primary objective of the claimed invention to provide a method of reading multiple-value memory cells requiring fewer components and offering greater flexibility in design considerations.

A method for reading a plurality of bits stored in a selected multiple-value memory cell of a nonvolatile semiconductor memory device includes the following steps in this order. A first data is obtained from a selected multiple-value memory cell by applying a first voltage to a control gate of the selected multiple-value memory cell. Next, a second data is obtained from the selected multiple-value memory cell by applying a second voltage to the control gate of the selected multiple-value memory cell. Performing a predetermined calculation on the first data and the second data generates a first bit of the plurality of bits stored in the selected multiple-value memory cell. Finally, a second bit of the plurality of bits is obtained from the selected multiple-value memory cell by applying a third voltage to the control gate of the selected multiple-value memory cell.

These and other objectives of the present invention will no doubt become obvious to those of ordinary skill in the art after reading the following detailed description of the preferred embodiment that is illustrated in the various figures and drawings.

DETAILED DESCRIPTION

Figure 8:
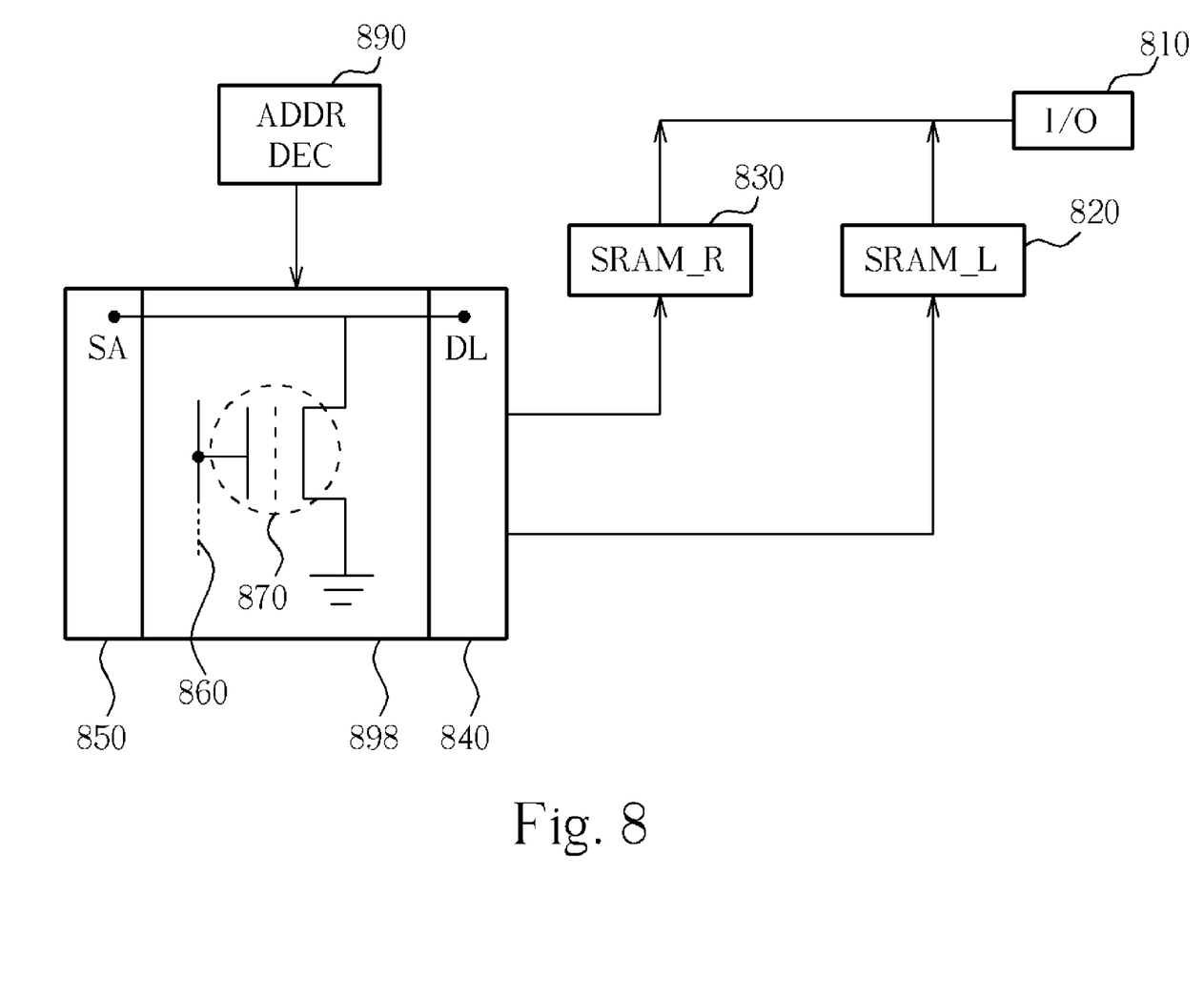
FIG. 8 is a block diagram of a memory system for reading multiple-value memory cells according to the present invention.

Please refer to FIG. 8. FIG. 8 is a block diagram of a non-limiting example application of the present invention. As shown in FIG. 8, there are a plurality of sense amplifiers 850, a plurality of data latches 840, a memory array 898 comprising a plurality of multiple-value memory cells 870 between the sense amplifiers 850 and the data latches 840, an address decoder 890 for address decoding, input/output ports 810, and SRAM_R (Static Random Access Memory) 830 and SRAM_L 820 between the input/output ports 810 and the plurality of data latches 840. A single sense amplifier of the plurality of sense amplifiers 850 and a single data latch of the plurality of data latches 840 uniquely correspond to a single multiple-value memory cell 870 of the memory array 898.

When in a read operation, the address decoder 890 decodes the address and selects a page (512 byte or more) of multiple-value memory cells 870 of the memory array, and the word line 860 coupled to the control gate of the selected multiple-value memory cells 870 is charged to read the data stored in the multiple-value memory cells 870. Data stored in memory cell is read out by sense amplifier and then transferred to data latch and further transferred from data latch to SRAM. Meanwhile, the 2 bits of data stored in multiple-value memory cell are divided into two groups. The odd numbered bit of the 2 bits of data are transferred to the SRAM_R 830(or SRAM_L 820), and the even numbered bit of the 2 bits of data are transferred to the SRAM_L 820 (or SRAM_R 830). Then the SRAM_R 830 and SRAM_L 820 transfer the received memory cell data to the I/O ports.

Figure 9:
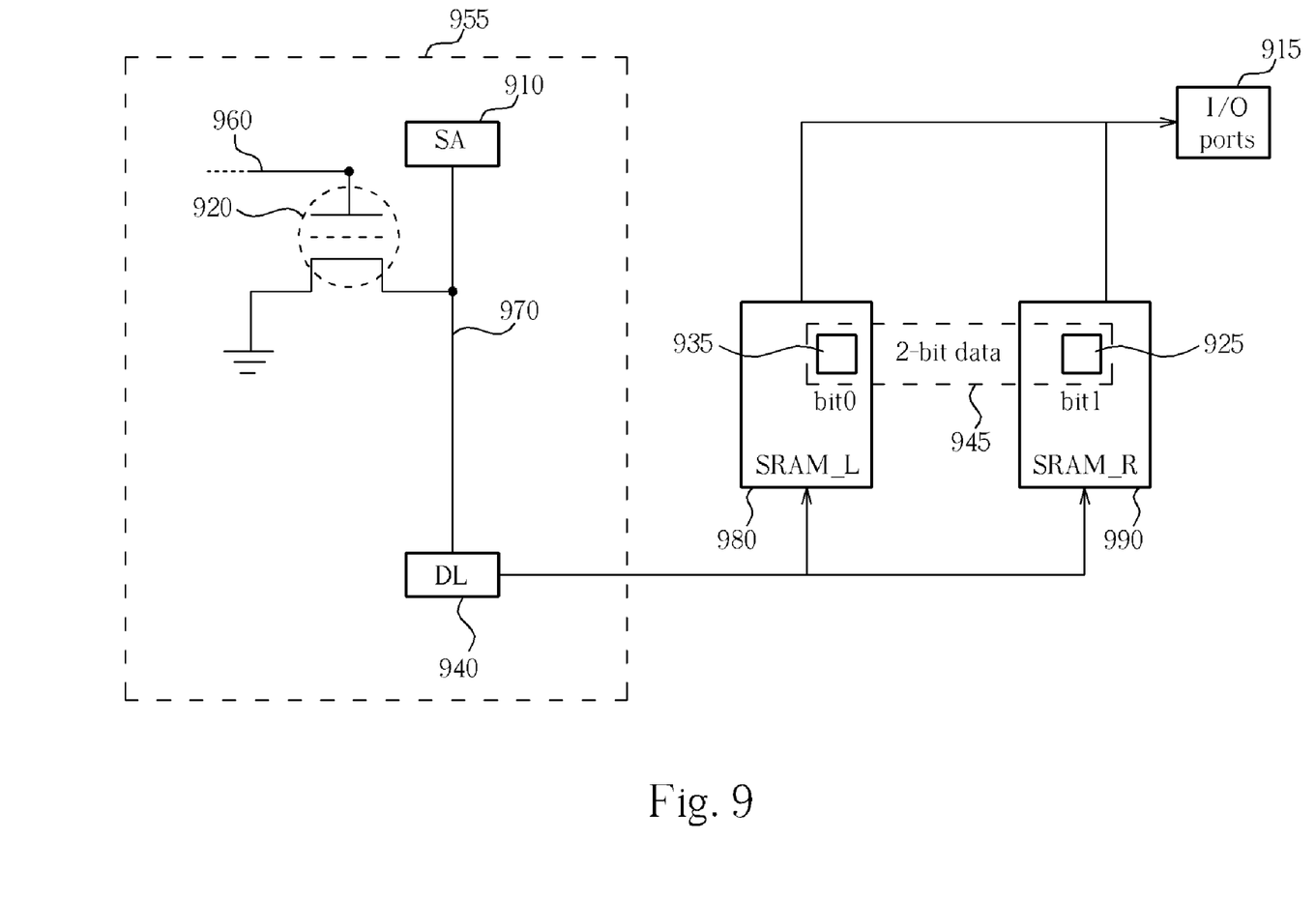
FIG. 9 is a circuit diagram of one multiple-value memory cell according to the present invention.

Please refer to FIG. 9. FIG. 9 illustrates a two-bit data 945 stored in one unit of a multiple-value memory cell 955 of the memory array 898 in FIG. 8 output through input/output ports 915. The unit of multiple-value memory cell 955 includes a data latch 940, a sense amplifier 910, and a multiple-value memory cell 920. The two-bit data 945 includes bit 0 (935) and bit 1 (925). Generally, one multiple-value memory cell is used to store two-bit data but more than two-bit data is also allowable.

Figure 10:
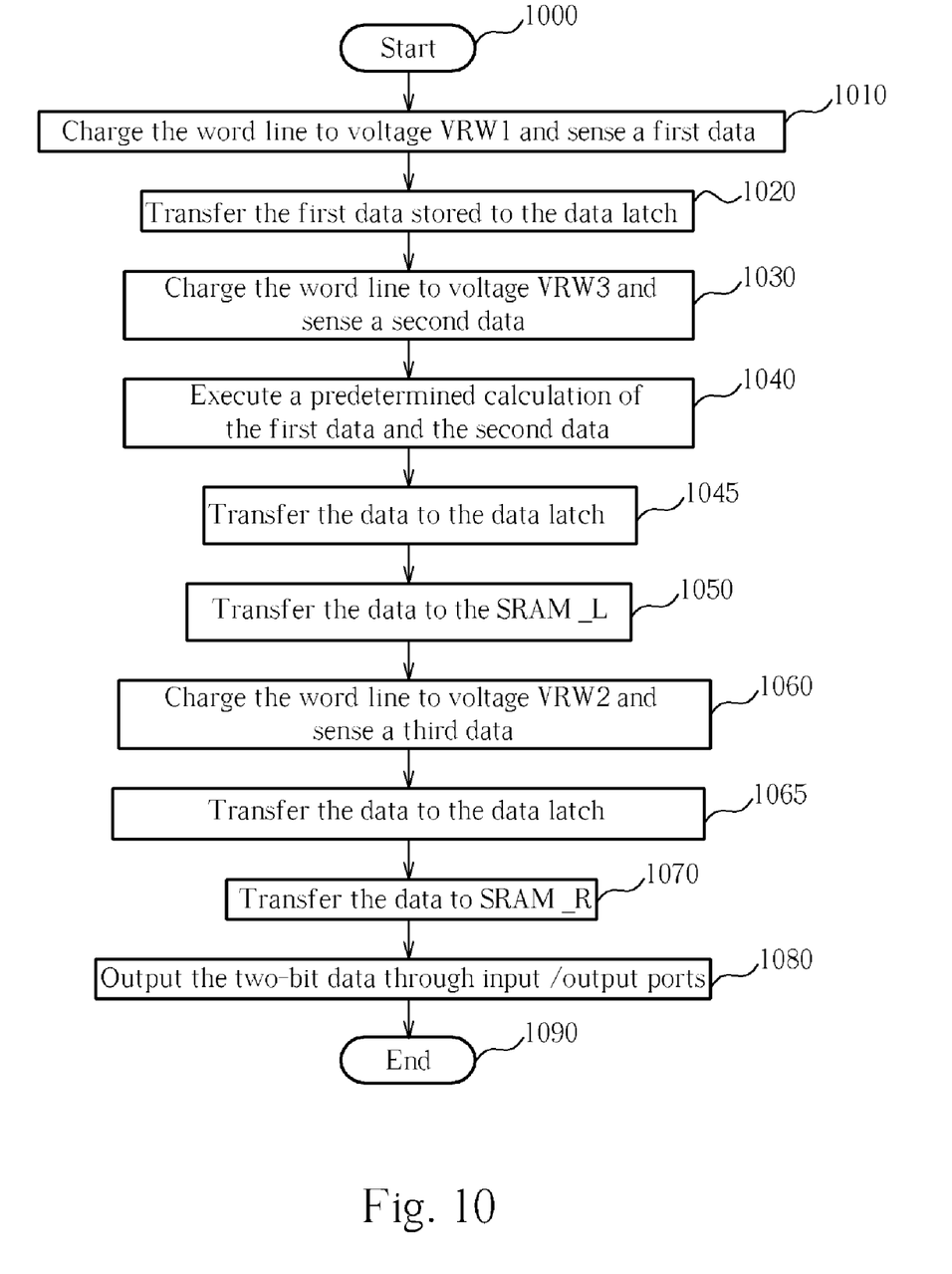
FIG. 10 is a flowchart of reading a multiple-value memory cell according to the present invention.

Please refer to FIG. 10 together with FIG. 9. FIG. 10 is a first embodiment of the read operation of FIG. 9 according to the present invention. In all embodiments of the present invention, VRW1<VRW2<VRW3. The steps in FIG. 10 are explained in order as follows.

Step 1000: Start.

Step 1010: Charge the word line 960 to voltage VRW1 and sense a first data stored in the selected multiple-value memory cell 920 using the sense amplifier 910 through the bit line 970.

Step 1020: Transfer the first data stored in the sense amplifier 910 to the data latch 940 through the bit line 970.

Step 1030: Charge the word line 960 to voltage VRW3 and sense a second data stored in the selected multiple-value memory cell 920 using the sense amplifier 910 through the bit line 970.

Step 1040: Execute a predetermined calculation of the first data stored in the data latch 940 and the second data stored in the sense amplifier 910 and store the result in sense amplifier 910.

Step 1045: Transfer the data stored in the sense amplifier 910 to the data latch 940 through the bit line 970.

Step 1050: Transfer the data stored in the data latch to the SRAM_L 980 as bit 0 (935) of the two bit data 945.

Step 1060: Charge the word line 960 to voltage VRW2 and sense a third data stored in the selected multiple-value memory cell 920 using the sense amplifier 910 through the bit line 970.

Step 1065: Transfer the data stored in the sense amplifier 910 to the data latch 940 through the bit line 970.

Step 1070: Transfer the data stored in the data latch to the SRAM_R 990 as bit 1 (925) of the two-bit data 945.

Step 1080: Output the two-bit data 945 stored in the SRAM_R 990 and SRAM_L 980 through input/output ports 915.

Step 1090: End.

Figure 11:
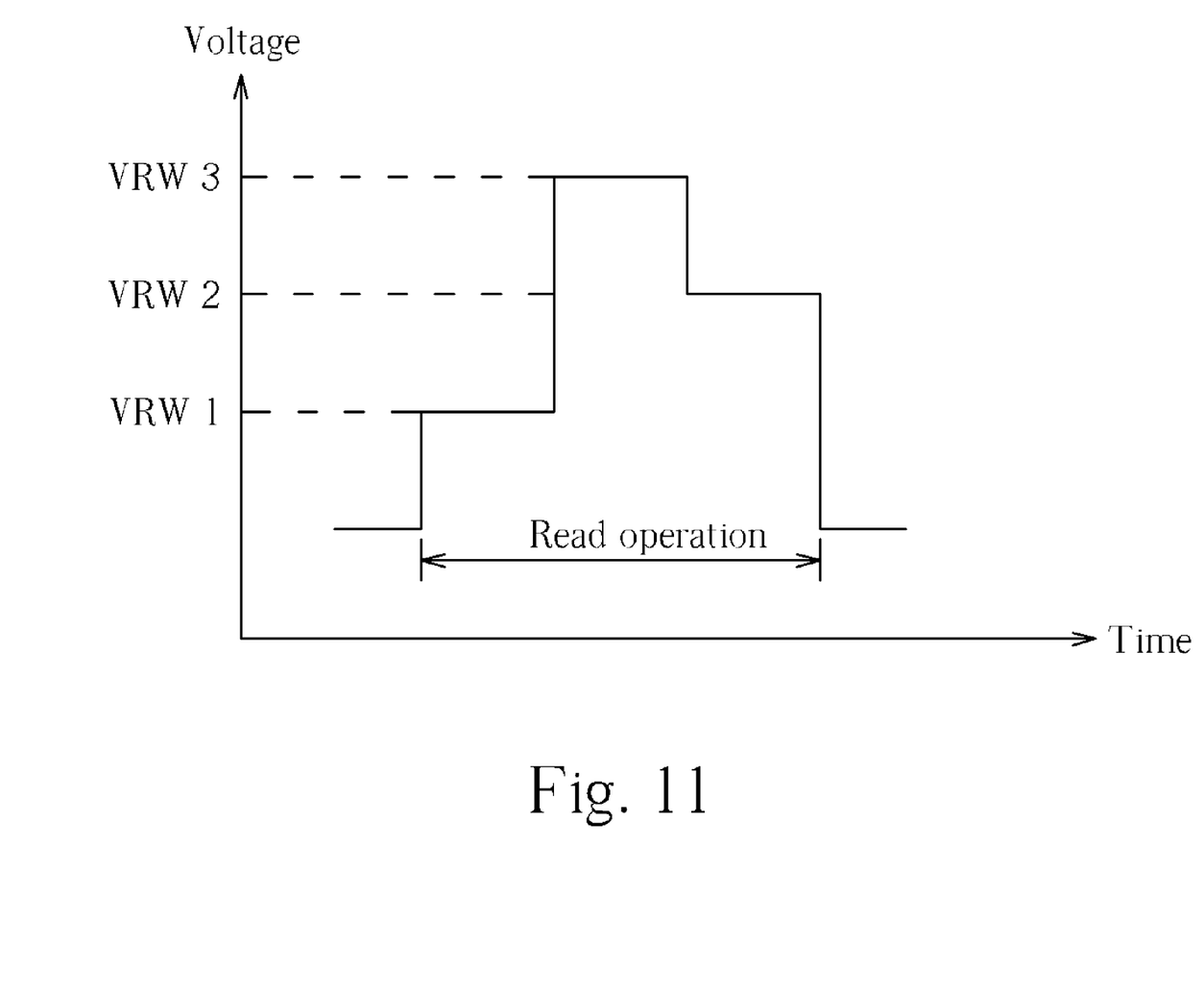
FIG. 11 is a diagram illustrating voltages of the word line in the read operation of FIG. 10.

Please refer to FIG. 11 together with FIG. 9. FIG. 11 shows the voltages of the word line 960 coupled to the selected multiple-value memory cell 920 during a read operation according to the first embodiment of the present invention. The vertical axis represents the voltages of the word line 960 coupled to the selected multiple-value memory cell 920 while the horizontal axis represents the time in the read operation. From FIG. 11, it is known that word line 960 during the read operation is first charged to voltage VRW1, then charged to voltage VRW3, and then discharged to voltage VRW2. The voltage sequence described above is different from the prior art and eliminates the necessity of a second data latch.

Figure 12:
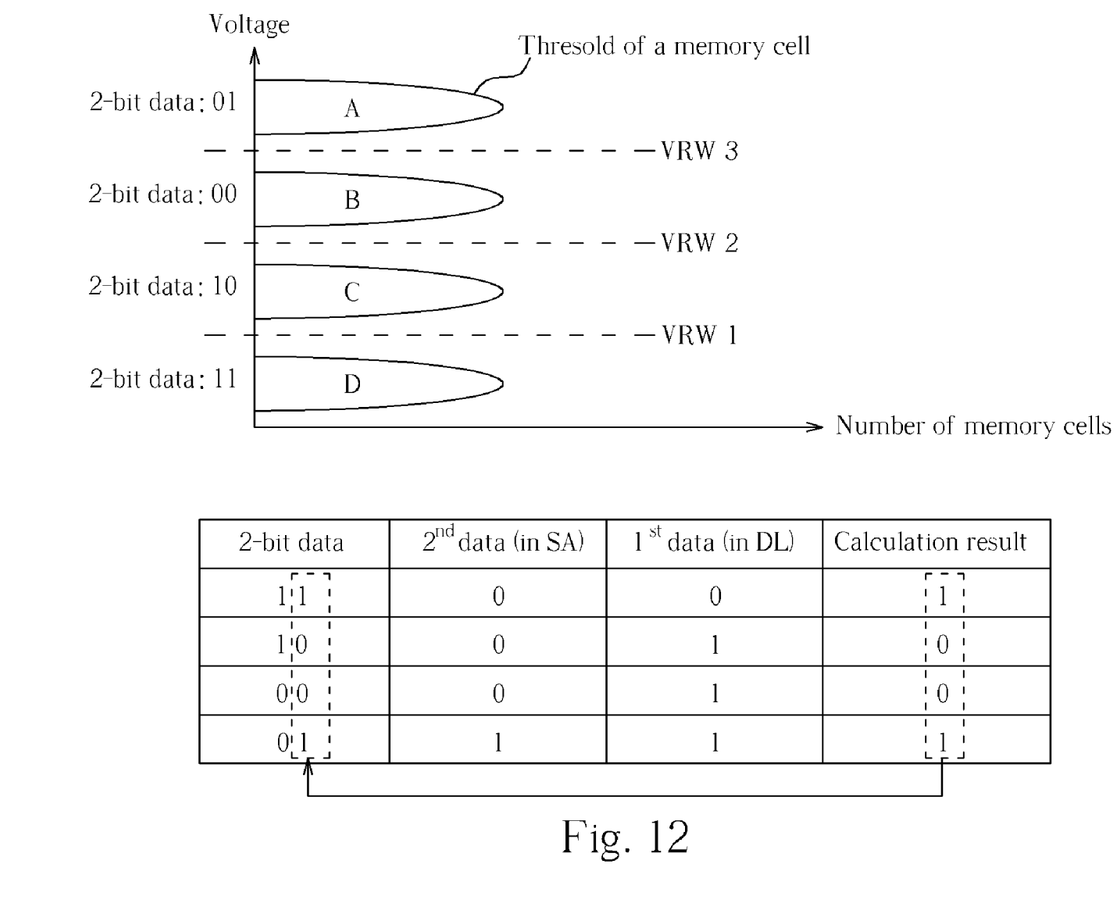
FIG. 12 is a diagram illustrating the relationships of a two-bit data stored in the multiple-value memory cell and the calculation.

Please refer to FIG. 12. FIG. 12 shows the data calculation result from the step 1040 in FIG. 10 of the first embodiment of the present invention. The data stored in the sense amplifier is the second data read from the voltage VRW3 stored in the multiple-value memory cell and the data stored in the data latch is the first data read from the voltage VRW1 stored in the multiple-value memory cell. The data calculation result is just bit 0 of the two-bit data transferred to the SRAM_L. For example, if the threshold of the memory cell belongs to distribution A, that means the two-bit data stored in the memory cell is "01". And if the threshold of the memory cell belongs to distribution B, that means the two-bit data stored in the memory cell is "00". Please notice that FIG. 11 does not show the calculation result of the first data being "0" and the second data being "1" because if the second data is "0", that means the threshold of the multiple-value memory cell belongs to distribution A so that the first data read from the voltage VRW1 must be "0", and this case is impossible.

Figure 13:
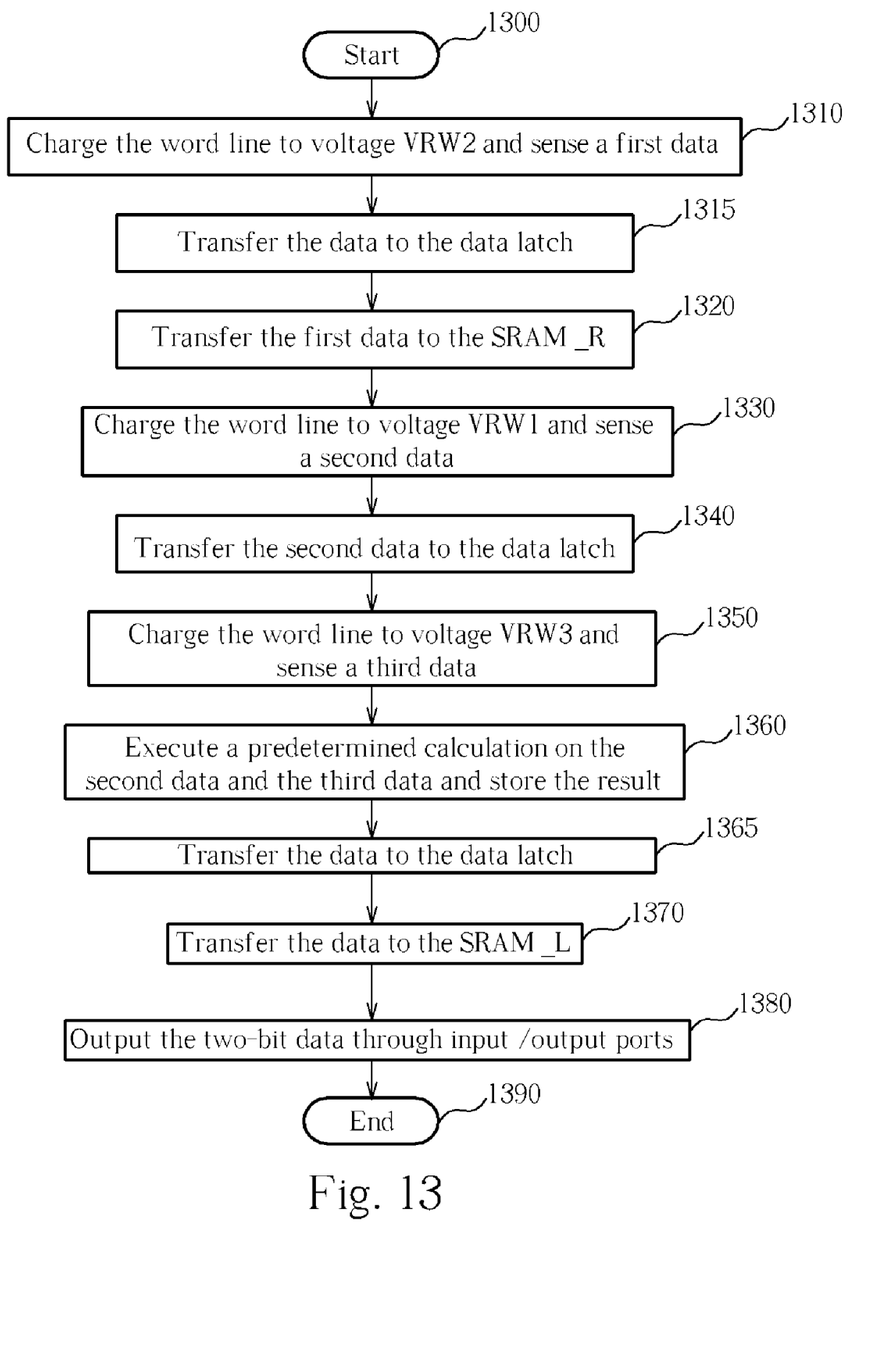
FIG. 13 is a flowchart of another read operation of a multiple-value memory cell according to the present invention.

Please refer to FIG. 13 together with FIG. 9. FIG. 13 is a second embodiment of a read method of the present invention. FIG. 13 is similar to FIG. 10. The difference between FIG. 13 and FIG. 10 is the order of the steps. The steps in FIG. 13 are described in order as follows.

Step 1300: Start.

Step 1310: Charge the word line 960 to voltage VRW2 and sense a first data stored in the selected multiple-value memory cell 920 using the sense amplifier 910 through the bit line 970.

Step 1315: Transfer the data stored in sense amplifier 910 to the data latch 940 through the bit line 970.

Step 1320: Transfer the first data stored in data latch 940 to the SRAM_R 990 as bit 1(925) of the two-bit data 945.

Step 1330: Charge the word line 960 to voltage VRW1 and sense a second data stored in the selected multiple-value memory cell 920 using the sense amplifier 910 through the bit line 970.

Step 1340: Transfer the second data stored in the sense amplifier 910 to the data latch 940 through the bit line 970.

Step 1350: Charge the word line 960 to voltage VRW3 and sense a third data stored in the selected multiple-value memory cell 920 using the sense amplifier 910 through the bit line 970.

Step 1360: Execute a predetermined calculation on the second data stored in the data latch 940 and the third data stored in the sense amplifier 910 and store the result in the sense amplifier 910.

Step 1365: Transfer the data stored in the sense amplifier 910 to the data latch 940 through the bit line 970.

Step 1370: Transfer the data stored in the data latch 940 to the SRAM_L 980 as bit 0 (935) of the two-bit data 945.

Step 1380: Output the two-bit data 945 stored in the SRAM_R 990 and SRAM_L 980 through input/output ports 915.

Step 1390: End.

Figure 14:
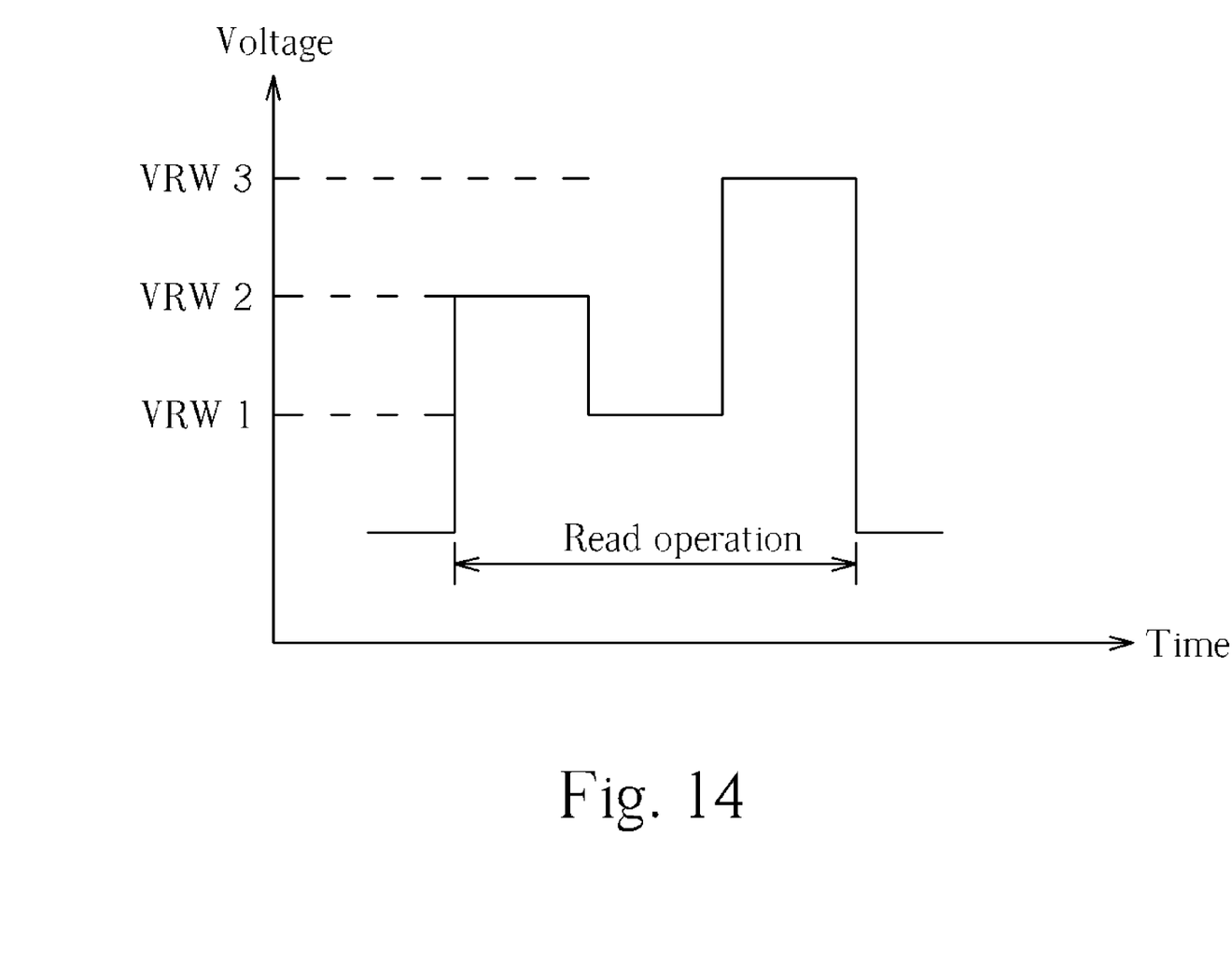
FIG. 14 is a diagram illustrating the voltages of the word line in the read operation of FIG. 13.

Please refer to FIG. 14. FIG. 14 shows the voltage of the word line coupled to the control gate of the selected multiple-value memory cell during a read operation according to a second embodiment of the present invention. The vertical axis represents the voltages of the word line coupled to the control gate of the selected multiple-value memory cell while the horizontal axis represents the time. From FIG. 14, it is known that the voltages of the word line coupled to the control gate of the selected multiple-value memory cell during the read operation of the present invention is first charged to VRW2, secondly discharged to VRW1, and charged again to VRW3. The voltage sequence described above is also different from the prior art and again eliminates the second data latch.

Using the read method of the present invention, only one data latch in each multiple-value memory unit is necessary, saving costs over the prior art. Additionally, the read method of the present invention also provides flexibility in voltage sequencing of the word line coupled to the control gate of the selected multiple-value memory cell providing more options when designing related circuitry.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for reading a plurality of bits stored in a selected multiple-value memory cell of a nonvolatile semiconductor memory device, the method comprising the following steps in this order:

obtaining a first data from the selected multiple-value memory cell by applying a first voltage to a control gate of the selected multiple-value memory cell;

obtaining a second data from the selected multiple-value memory cell by applying a second voltage to the control gate of the selected multiple-value memory cell;

obtaining a first bit of the plurality of bits stored in the selected multiple-value memory cell by performing a predetermined calculation on the first data and the second data; and obtaining a second bit of the plurality of bits from the selected multiple-value memory cell by applying a third voltage to the control gate of the selected multiple-value memory cell.

2. The method of claim 1, wherein the third voltage is higher than the first voltage and lower than the second voltage.

3. A method for reading a plurality of bits stored in a selected multiple-value memory cell of a nonvolatile semiconductor memory device, the method comprising the following steps in this order:

obtaining a first bit of the plurality of bits from the selected multiple-value memory cell by applying a first voltage to the control gate of the selected multiple-value memory cell;

obtaining a first data from the selected multiple-value memory cell by applying a second voltage to the control gate of the selected multiple-value memory cell;

obtaining a second data from the selected multiple-value memory cell by applying a third voltage to the control gate of the selected multiple-value memory cell; and obtaining a second bit of the plurality of bits stored in the selected multiple-value memory cell by performing a predetermined calculation on the first data and the second data.

4. The method of claim 3, wherein the first voltage is higher than the second voltage and lower than the third voltage.

5. A method for reading a plurality of bits stored in a selected multiple-value memory cell of a nonvolatile semiconductor memory device, the method comprising:

obtaining a first data by applying a first voltage to a control gate of the selected multiple-value memory cell;

obtaining a second data by applying a second voltage to the control gate of the selected multiple-value memory cell, the second voltage being higher than the first voltage;

obtaining a first bit of the plurality of bits stored in the selected multiple-value memory cell by performing a predetermined calculation on the first data and the second data; and obtaining a second bit of the plurality of bits by applying a third voltage to the control gate of the selected multiple-value memory cell, the third voltage being lower than the second voltage and higher than the first voltage.

* * * * *